United States Patent
Osawa et al.

(10) Patent No.: US 11,637,232 B2
(45) Date of Patent: Apr. 25, 2023

(54) ACOUSTIC WAVE DEVICE INCLUDING LI2CO3 LAYER ON PIEZOELECTRIC SUBSTRATE MADE OF LINBO3 OR LITAO3

(71) Applicant: Murata Manufacturing Co., Ltd., Nagaokakyo (JP)

(72) Inventors: Takashi Osawa, Nagaokakyo (JP); Masaki Tsutsumi, Nagaokakyo (JP); Masahiro Fukushima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 281 days.

(21) Appl. No.: 16/928,024

(22) Filed: Jul. 14, 2020

(65) Prior Publication Data

US 2021/0036211 A1 Feb. 4, 2021

(30) Foreign Application Priority Data

Jul. 31, 2019 (JP) .............................. JP2019-140698

(51) Int. Cl.
*H01L 41/187* (2006.01)
*H01L 41/047* (2006.01)
*H01L 41/09* (2006.01)

(52) U.S. Cl.
CPC ...... *H01L 41/1873* (2013.01); *H01L 41/0474* (2013.01); *H01L 41/0973* (2013.01)

(58) Field of Classification Search
CPC ............. H01L 41/0474; H01L 41/0973; H01L 41/1873
USPC .......................................................... 310/311
See application file for complete search history.

(56) References Cited

U.S. PATENT DOCUMENTS

2014/0270617 A1* 9/2014 Muller .................. G02F 1/0316
  385/3
2019/0035754 A1* 1/2019 Uesaka .................. H03H 9/059

FOREIGN PATENT DOCUMENTS

JP   2001-102898 A   4/2001
JP   2007-165949 A   6/2007

* cited by examiner

*Primary Examiner* — Shawki S Ismail
*Assistant Examiner* — Monica Mata
(74) *Attorney, Agent, or Firm* — Keating & Bennett, LLP

(57) ABSTRACT

An acoustic wave device includes a piezoelectric substrate made of $LiNbO_3$ or $LiTaO_3$ and including first and second main surfaces that face each other, a functional electrode provided on the first main surface of the piezoelectric substrate to excite acoustic waves, and a $Li_2CO_3$ layer provided on the second main surface of the piezoelectric substrate.

14 Claims, 3 Drawing Sheets

ACOUSTIC WAVE DEVICE INCLUDING LI2CO3 LAYER ON PIEZOELECTRIC SUBSTRATE MADE OF LINBO3 OR LITAO3

CROSS REFERENCE TO RELATED APPLICATIONS

This application claims the benefit of priority to Japanese Patent Application No. 2019-140698 filed on Jul. 31, 2019. The entire contents of this application are hereby incorporated herein by reference.

BACKGROUND OF THE INVENTION

1. Field of the Invention

The present invention relates to an acoustic wave device that includes a piezoelectric substrate made of $LiNbO_3$ or $LiTaO_3$.

2. Description of the Related Art

To date, various acoustic wave devices have been proposed that use piezoelectric substrates made of $LiNbO_3$, $LiTaO_3$, and so forth. A piezoelectric wafer is transported by a transporting arm during the manufacture of these types of acoustic wave devices. The manufacturing process may stop if the piezoelectric wafer becomes charged and sticks to the transporting arm.

In the acoustic wave device disclosed in Japanese Unexamined Patent Application Publication No. 2001-102898, films made of a resistive material are provided on both main surfaces of a piezoelectric substrate in order to suppress charging of the piezoelectric substrate. It is described that it is desirable to use an organic material, an inorganic oxide such as $SiO_2$, $Al_2O_3$ or MgO, or semi-conductive material such as Si as the resistive material. The films made of a resistive material are formed by sputtering.

On the other hand, Japanese Unexamined Patent Application Publication No. 2007-165949 discloses an acoustic wave device having a WLP structure. In this case, an Al film or the like is formed by vapor deposition or plating on the surface of a piezoelectric substrate that is on the opposite side from the surface of the piezoelectric substrate where an IDT electrode will be provided.

The film made of a resistive material disclosed in Japanese Unexamined Patent Application Publication No. 2001-102898 is formed by sputtering. Therefore, vacuum batch processing is necessary. Consequently, there is a problem in that productivity is poor. In addition, there is a risk of cracks occurring in the piezoelectric substrate due to heating of the piezoelectric substrate during the sputtering process.

In the acoustic wave device disclosed in Japanese Unexamined Patent Application Publication No. 2007-165949, the Al film is formed by vapor deposition or plating. Vacuum batch processing is necessary during the vapor deposition and therefore productivity is poor. In addition, there is a risk of cracks occurring in the piezoelectric substrate due to heating of the piezoelectric substrate during the vapor deposition.

Furthermore, a large amount of time is necessary and productivity is poor when an Al film or the like is formed by plating.

SUMMARY OF THE INVENTION

Preferred embodiments of the present invention provide acoustic wave devices that each have excellent productivity and in each of which a piezoelectric substrate thereof is not susceptible to becoming charged and consequently transportation failures due to charging are unlikely to occur.

A preferred embodiment of the present invention provides an acoustic wave device that includes a piezoelectric substrate made of $LiNbO_3$ or $LiTaO_3$ and including first and second main surfaces that face each other; a functional electrode that is provided on the first main surface of the piezoelectric substrate and that excites acoustic waves; and a $Li_2CO_3$ layer that is provided on the second main surface of the piezoelectric substrate.

The acoustic wave devices according to the preferred embodiments of the present invention each have excellent productivity and a piezoelectric substrate thereof is not susceptible to becoming charged. Therefore, transportation failures arising from charging are unlikely to occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be clarified by describing preferred embodiments of the present invention with reference to the drawings.

The preferred embodiments described in the present specification are non-limiting illustrative examples and portions of the configurations illustrated in different preferred embodiments can be substituted for one another or combined with one another.

Figure 1:
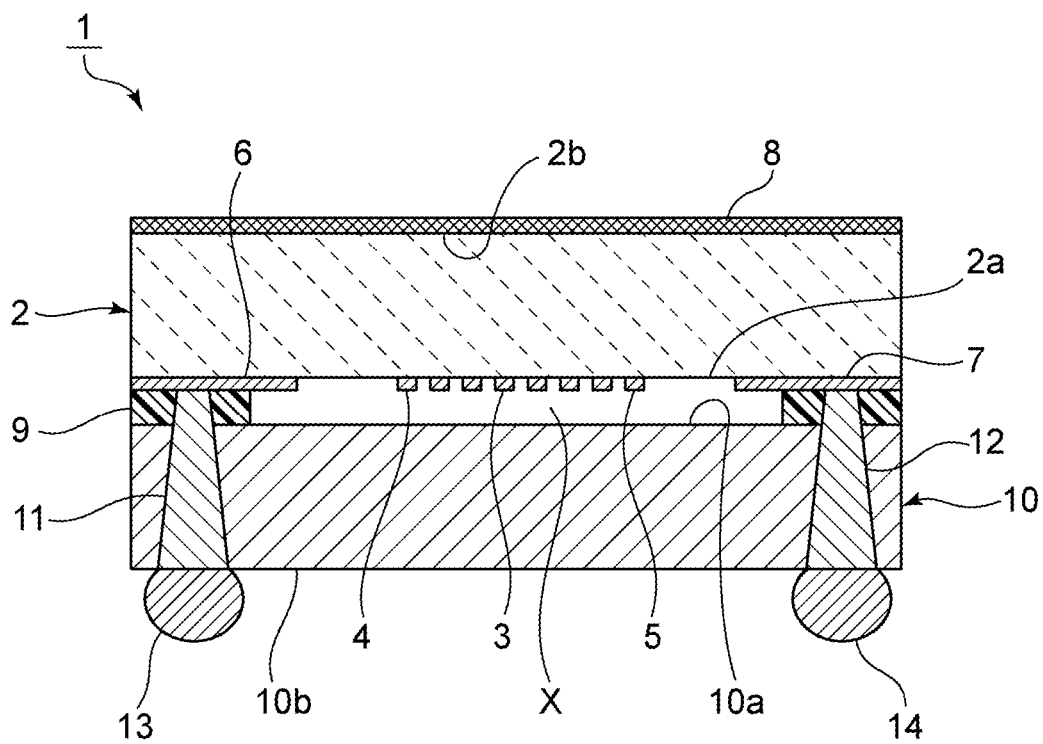
FIG. 1 is a front sectional view of an acoustic wave device according to a first preferred embodiment of the present invention.

FIG. 1 is a front sectional view of an acoustic wave device according to a first preferred embodiment of the present invention.

An acoustic wave device 1 preferably has a WLP structure. The acoustic wave device 1 includes a piezoelectric substrate 2 preferably made of $LiNbO_3$, for example. The piezoelectric substrate 2 may instead be made of $LiTaO_3$, for example. The piezoelectric substrate 2 includes a first main surface 2a and a second main surface 2b that is on the opposite side from the first main surface 2a. An IDT electrode 3 and reflectors 4 and 5 are provided as functional electrodes on the first main surface 2a. The acoustic wave device 1 is preferably configured as a one-port surface acoustic wave resonator, for example. However, the structure of the functional electrodes including the IDT electrode 3 and the reflectors 4 and 5 and so on is not limited to this example. Functional electrodes may be provided so as to define an acoustic wave filter and other acoustic wave elements, for example.

Wiring line electrodes 6 and 7 are provided on the first main surface 2a. The wiring line electrodes 6 and 7 are electrically connected to the IDT electrode 3 in a portion that is not illustrated.

A frame-shaped support layer 9 is provided on the first main surface 2a of the piezoelectric substrate 2. The support layer 9 defines a hollow portion X. The support layer 9 surrounds the portion where the IDT electrode 3 is provided. The support layer 9 is made of a suitable insulating material such as, for example, a composite resin.

A cover 10 is fixed to the support layer 9 so as to close the frame-shaped opening of the support layer 9. The cover 10 is preferably made of, for example, an insulating ceramic such as alumina or a composite resin. The region enclosed by the cover 10, the support layer 9, and the piezoelectric substrate 2 defines the hollow portion X. The IDT electrode 3 is located inside the hollow portion X.

A plurality of through holes penetrate through the support layer 9 and the cover 10. Under bump metal layers 11 and 12 are respectively provided inside the through holes. One end of the under bump metal layer 11 is bonded to the wiring line electrode 6 and the other end of the under bump metal layer 11 is bonded to a metal bump 13. One end of the under bump metal layer 12 is bonded to the wiring line electrode 7 and the other end of the under bump metal layer 12 is bonded to a metal bump 14. The metal bumps 13 and 14 are located on the outside of the cover 10.

The acoustic wave device 1 can be mounted on, for example a printed circuit board or the like using the metal bumps 13 and 14. The metal bumps 13 and 14 are made of a metal or an alloy such as solder or Au, for example.

The IDT electrode 3, the reflectors 4 and 5, the wiring line electrodes 6 and 7, and the under bump metal layers 11 and 12 are made of a suitable metal or alloy. Furthermore, the IDT electrode 3, the reflectors 4 and 5, and so on may be made of multilayer metal films including a plurality of metal films.

A $Li_2CO_3$ layer 8 is stacked on the second main surface 2b of the piezoelectric substrate 2. In FIG. 1, the $Li_2CO_3$ layer 8 covers the entire or substantially the entire second main surface 2b. However, the $Li_2CO_3$ layer 8 may instead be provided on only a portion of the second main surface 2b. In other words, the $Li_2CO_3$ layer 8 may be provided in a partial manner on a portion of the second main surface 2b of the piezoelectric substrate 2. In this case, the planar shape and pattern shape of the $Li_2CO_3$ layer 8 are not particularly limited. In other words, an arbitrary planar shape may be used such as, for example, a plurality of dot-shaped $Li_2CO_3$ layers 8.

The electrical resistance, i.e., the surface resistivity of $Li_2CO_3$ is about $10^5 \Omega$ to $10^7 \Omega$, for example. On the other hand, the surface resistivity of $LiNbO_3$ is greater than or equal to about $10^8 \Omega$, for example. In other words, the electrical resistance of $Li_2CO_3$ is lower than that of $LiNbO_3$.

A transporting arm is used in a process of manufacturing or mounting an acoustic wave device. In this case, at the mother piezoelectric wafer stage prior to the mother piezoelectric wafer being divided into individual chips, the transporting arm is used to support the surface of the piezoelectric wafer on the opposite side from the surface on which the IDT electrode will be formed and transport the piezoelectric wafer. If the piezoelectric wafer is susceptible to becoming charged, there is a risk of the piezoelectric wafer becoming stuck to the transporting arm and not releasing from the transporting arm.

In contrast, in the acoustic wave device 1, the $Li_2CO_3$ layer 8 is provided on the second main surface 2b of the piezoelectric substrate 2 and, therefore, the piezoelectric substrate 2 is not susceptible to becoming charged. Therefore, the acoustic wave device 1 whose piezoelectric substrate is at the wafer stage prior to dividing of the wafer can be smoothly transported by the transporting arm. In addition, the $Li_2CO_3$ layer can be easily formed by irradiating one surface of the piezoelectric substrate at the wafer stage with a laser. Therefore, it is unlikely that a reduction in productivity will occur.

Figure 2:
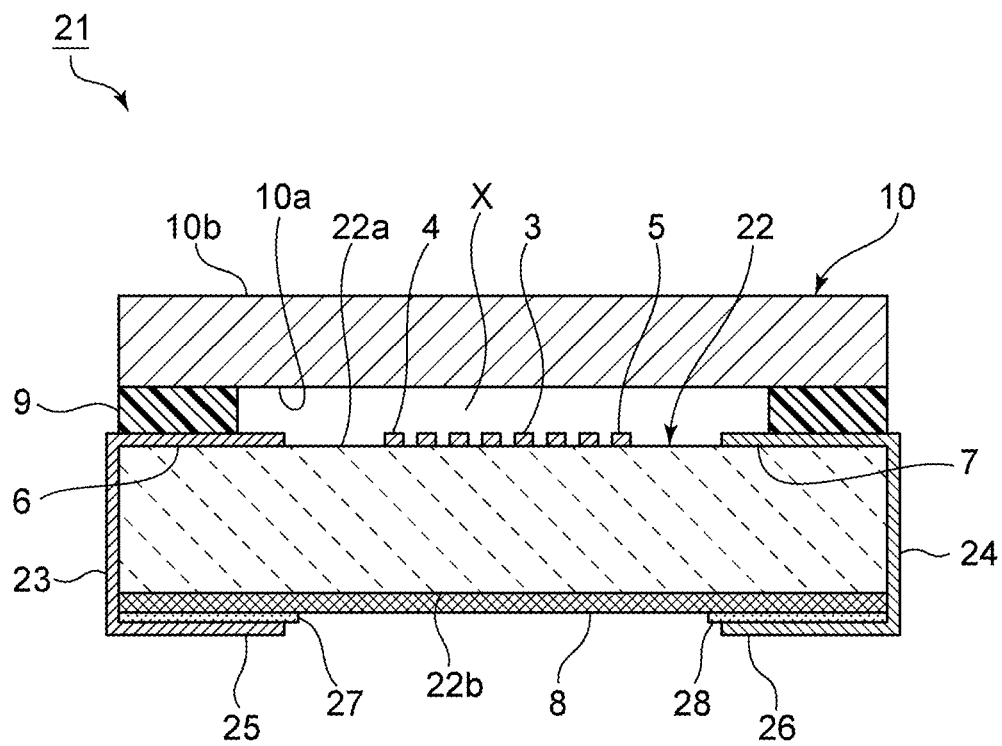
FIG. 2 is a front sectional view of an acoustic wave device according to a second preferred embodiment of the present invention.

FIG. 2 is a front sectional view of an acoustic wave device according to a second preferred embodiment of the present invention.

A piezoelectric substrate 22 of an acoustic wave device 21 is preferably made of $LiNbO_3$ or $LiTaO_3$, for example. In the acoustic wave device 21, wiring line electrodes 6 and 7 are connected to terminal electrodes 25 and 26 via connection electrodes 23 and 24. The wiring line electrodes 6 and 7 are provided on a first main surface 22a of the piezoelectric substrate 22. The terminal electrodes 25 and 26 are stacked on a second main surface 22b of the piezoelectric substrate 22 with a $Li_2CO_3$ layer 8 and insulating layers 27 and 28 interposed therebetween.

First ends of the connection electrodes 23 and 24 are connected to the wiring line electrodes 6 and 7 and second ends of the connection electrodes 23 and 24 are connected to the terminal electrodes 25 and 26. Therefore, the acoustic wave device 21 can be mounted on a printed circuit board or the like, for example, using the terminal electrodes 25 and 26. The connection electrodes and 24 extend along the side surfaces of the piezoelectric substrate 22, which connect the first main surface 22a and the second main surface 22b to each other.

The boundaries between the wiring line electrodes 6 and and the connection electrodes 23 and 24 and the boundaries between the connection electrodes 23 and 24 and the terminal electrodes 25 and 26 are not clear in FIG. 2. However, the positions of these boundaries are not particularly restricted since these members are manufactured in an integrated manner using the same metal material. For example, the portions located on the first main surface 22a may be regarded as the wiring electrodes 6 and 7 and the portions located on the insulating layers 27 and 28 may be regarded as the terminal electrodes 25 and 26. Furthermore, the portions that connect the wiring line electrodes 6 and 7 and the terminal electrodes 25 and 26 to each other may be regarded as the connection electrodes 23 and 24.

The connection electrodes 23 and 24 and the terminal electrodes 25 and 26 can be made using a metal material similarly to the wiring line electrodes 6 and 7.

The insulating layers 27 and 28 are preferably made of an insulating ceramic or a composite resin such as silicon oxide or silicon oxynitride, for example.

In the acoustic wave device 21, a cover 10 is provided to close the opening of a support layer 9. Thus, a hollow portion X is provided.

The rest of the configuration of the acoustic wave device 21 is the same or substantially the same as that of the acoustic wave device 1. Therefore, the same portions are denoted by the same reference symbols and description thereof is omitted.

In the present preferred embodiment, the $Li_2CO_3$ layer 8 is provided on the second main surface 22b. Therefore, in the case of the acoustic wave device 21, the piezoelectric substrate 22 is not susceptible to becoming charged when transporting the acoustic wave device 21 or when transporting a piezoelectric substrate at the mother wafer stage using a transporting arm. Therefore, transportation using a transporting arm can be easily performed. As described above, the $Li_2CO_3$ layer 8 can be easily formed using laser irradiation. Therefore, it is unlikely that a reduction in productivity will occur.

Next, a specific description will be provided of an example of the process of forming the $Li_2CO_3$ layer 8 by laser irradiation while referring to FIGS. 3 to 8.

Figure 3:
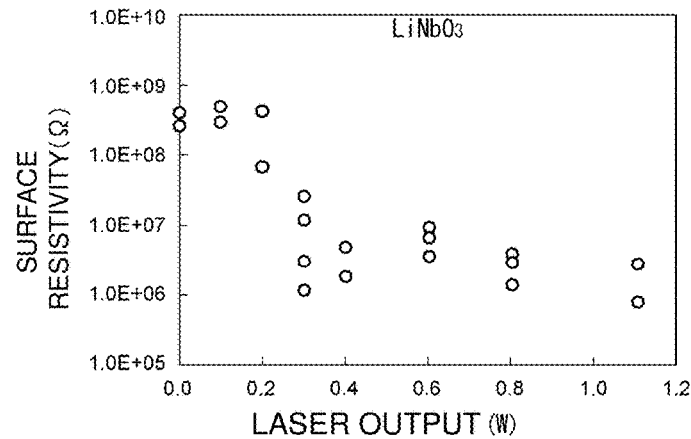
FIG. 3 is a diagram illustrating the relationship between laser output and surface resistivity when a piezoelectric substrate made of $LiNbO_3$ is irradiated with a laser.

FIG. 3 is a diagram illustrating the relationship between laser light output and the post-laser-irradiation surface resistivity of the surface of a wafer irradiated with a laser when the surface of a piezoelectric wafer made of $LiNbO_3$ is irradiated with laser light. A nanosecond pulse laser was used as the laser. The wavelength was about 355 nm, the pulse width was about 10 ns, the frequency was about 250 kHz, the beam diameter was about 25 μm, the scanning speed was about 500 nm/s, and the scanning pitch was about 20 μm. Under these conditions, the laser output was changed to various values and the corresponding values of the surface resistivity of the surface of the piezoelectric substrate were obtained.

As is clear from FIG. 3, the surface resistivity was high with a value greater than or equal to about $1.0 \times 10^8 \Omega$ in a laser output range from 0 W, i.e., prior to the laser irradiation, to about 0.2 W. In contrast, the surface resistivity dropped when the laser output exceeded about 0.3 W, and in particular, the surface resistivity had a value less than or equal to about $1.0 \times 10^7 \Omega$ when the laser output exceeded about 0.4 W. This is attributed to the formation of a low-resistance $Li_2CO_3$ layer on the surface of the piezoelectric substrate due to the laser irradiation.

Figure 4:
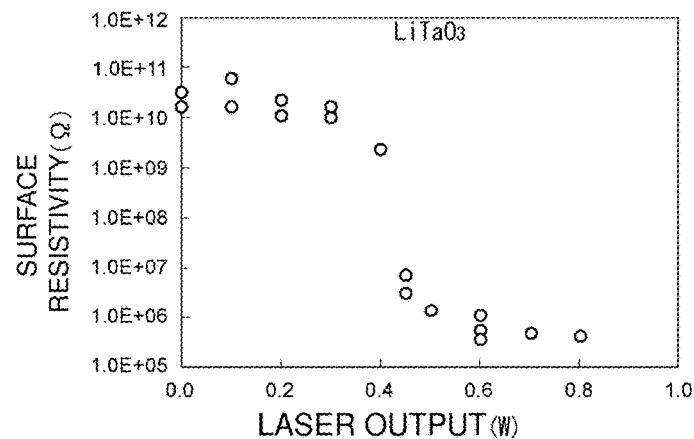
FIG. 4 is a diagram illustrating the relationship between laser output and surface resistivity when a piezoelectric substrate made of $LiTaO_3$ is irradiated with a laser.

FIG. 4 illustrates the relationship between the laser light output and the post-laser-irradiation surface resistivity of the surface of a piezoelectric wafer irradiated with a laser when a laser is irradiated in the same or substantially the same manner as described above using a piezoelectric wafer made of $LiTaO_3$.

In this case, the laser irradiation conditions were as follows. A nanosecond pulse laser was used. The wavelength was about 532 nm, the pulse width was about 25 ns, the frequency was about 500 kHz, the beam diameter was about 30 μm, the scanning speed was about 100 nm/s, and the scanning pitch was about 20 μm. Under these conditions, the laser output was changed to various values and the entirety or substantially the entirety of one surface of a piezoelectric wafer was processed.

As is clear from FIG. 4, the surface resistivity was high with a value greater than or equal to about $1.0 \times 10^{10} \Omega$ in a laser output range from 0 W, i.e., prior to the laser irradiation, to about 0.3 W. In contrast, it is clear that the surface resistivity rapidly dropped to less than or equal to about $1.0 \times 10^7 \Omega$ when the laser output exceeded about 0.4 W. This is attributed to the formation of a low-resistance $Li_2CO_3$ layer on the surface of the piezoelectric substrate due to the laser irradiation.

Next, specific examples 1 and 2 of preferred embodiments of the present invention will be described.

Example 1

A piezoelectric wafer made of $LiNbO_3$ was prepared in order to manufacture the acoustic wave device 1 according to the first preferred embodiment. The surface of the piezoelectric wafer on the opposite side from the surface where the IDT electrode was to be formed was subjected to laser irradiation. A nanosecond pulse laser was used and the irradiation conditions were as follows.

The wavelength was about 355 nm, the pulse width was about 10 ns, the frequency was about 250 kHz, the average output was about 0.4 W, the beam diameter was about 25 μm, the scanning speed was about 500 nm/s, and the scanning pitch was about 20 μm. The entirety or substantially the entirety of one surface of the piezoelectric wafer was processed under these conditions. The acoustic wave device 1 was manufactured using the piezoelectric wafer obtained as described above. The incidence of transportation failures in this manufacturing process, i.e., the incidence of failures in which the equipment stopped due to the piezoelectric wafer becoming charged and sticking to the transporting arm, was close to 0%. For comparison, the incidence of such transportation failures in a comparative example 1, in which a piezoelectric wafer that had not been subjected to laser processing was used, was about 3%.

Figure 5:
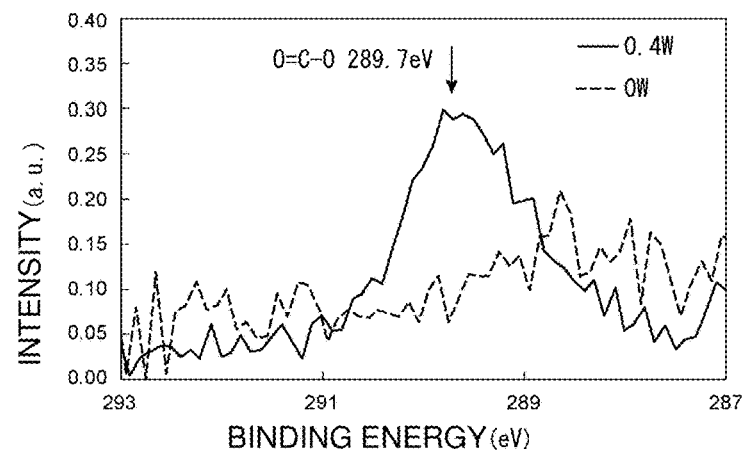
FIG. 5 is a diagram illustrating XPS spectra of C1s of $LiNbO_3$ substrates of acoustic wave devices of an example 1 of a preferred embodiment of the present invention and a comparative example 1.

FIG. 5 is a diagram illustrating the XPS spectra of C1s of the $LiNbO_3$ substrates of the acoustic wave devices of example 1 and comparative example 1. The solid line represents the results of example 1 and the broken line represents the results of comparative example 1. The results of example 1 are results for a surface that has been subjected to the laser processing described above. It is clear from FIG. 5 that the binding energy intensity is high at about 289.7 eV, which indicates the binding energy of O=C—O, in example 1, whereas the intensity at this binding energy value is low in comparative example 1.

Figure 6:
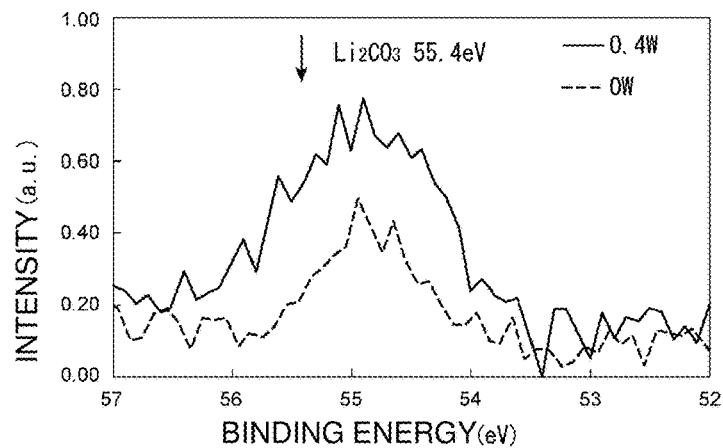
FIG. 6 is a diagram illustrating XPS spectra of Li1s of $LiNbO_3$ substrates of the acoustic wave devices of example 1 and comparative example 1.

On the other hand, FIG. 6 is a diagram illustrating the XPS spectra of Li1s of the $LiNbO_3$ substrates of the acoustic wave devices of example 1 and comparative example 1. In FIG. 6 as well, the solid line represents the results of example 1 and the broken line represents the results of comparative example 1.

It can be seen that the intensity at about 55.4 eV resulting from $Li_2CO_3$ is high with a value of about 0.60 a.u. in example 1, whereas the intensity at this binding energy value is low in comparative example 1.

Therefore, it is clear from FIGS. 5 and 6 that a $Li_2CO_3$ layer is formed on one surface of the piezoelectric wafer by laser irradiation in example 1.

Example 2

$LiTaO_3$ was prepared for the piezoelectric wafer instead of $LiNbO_3$ and the piezoelectric wafer was irradiated with a laser. The laser irradiation conditions were as follows.

The wavelength was about 532 nm, the pulse width was about 25 ns, the frequency was about 500 kHz, the average output was about 0.5 W, the beam diameter was about 30 μm, the scanning speed was about 100 nm/s, and the scanning pitch was about 20 μm. The entire or substantially the entire surface of the piezoelectric wafer was irradiated with laser light under these conditions.

The acoustic wave device 1 of Example 2 was obtained with the WLP structure manufacturing process in the same or substantially the same way as in example 1 using a piezoelectric wafer obtained as described above. Furthermore, an acoustic wave device of a comparative example 2 was prepared in the same or substantially the same way as in example 2 except that a piezoelectric wafer was used that had not been subjected to laser processing.

In example 2, the incidence of failures in which the equipment stopped due to the piezoelectric wafer becoming charged and sticking to the transporting arm was 0%. In contrast, in comparative example 2, the incidence of transportation failures was about 3%.

As described above, it was also possible to reliably reduce or prevent transportation failures by providing a $Li_2CO_3$ layer in the acoustic wave device 1 in which $LiTaO_3$ is used.

Figure 7:
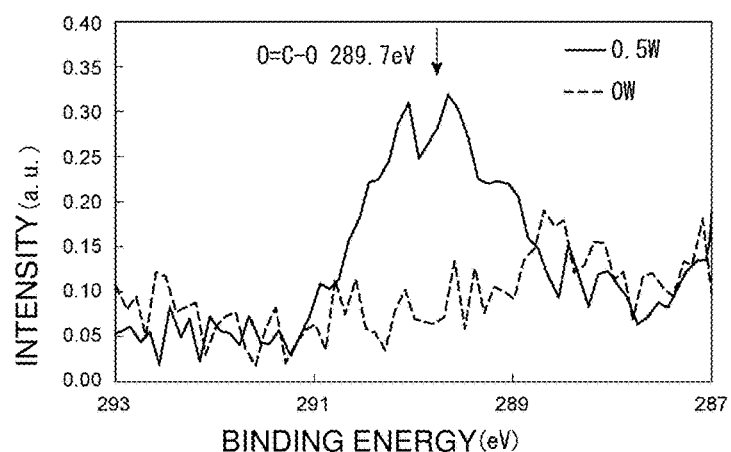
FIG. 7 is a diagram illustrating XPS spectra of C1s of second main surfaces of piezoelectric substrates made of $LiTaO_3$ in acoustic wave devices of an example 2 of a preferred embodiment of the present invention and a comparative example 2.
Figure 8:
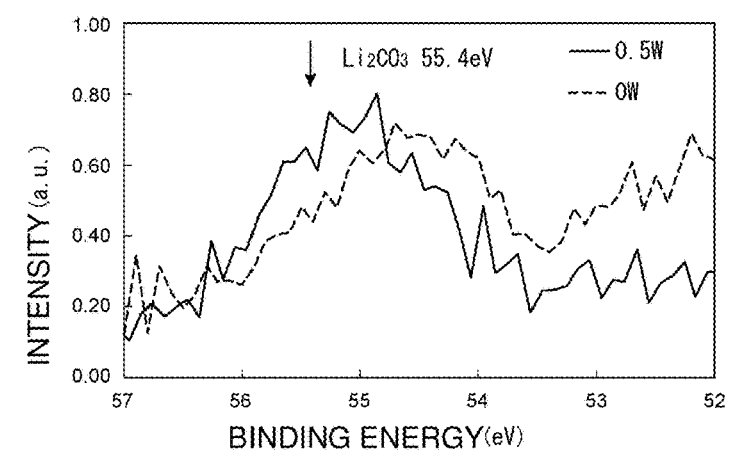
FIG. 8 is a diagram illustrating XPS spectra of Li1s of the second main surfaces of piezoelectric substrates made of $LiTaO_3$ in the acoustic wave devices of example 2 and comparative example 2.

FIG. 7 is a diagram illustrating XPS spectra of C1s of second main surfaces of the piezoelectric substrates made of $LiTaO_3$ in the acoustic wave devices of example 2 and comparative example 2. FIG. 8 is a diagram illustrating XPS spectra of Li1s of the second main surfaces of the piezoelectric substrates made of $LiTaO_3$ in the acoustic wave devices of example 2 and comparative example 2. In FIGS. 7 and 8, the solid line represents the results of example 2 and the broken line represents the results of comparative example 2. The XPS spectra of the laser irradiated surface in example 2 are illustrated.

It is clear from FIG. 7 that the intensity at about 289.7 eV, which is the value of the binding energy of the O=C—O bond, is much higher in example 2 than in comparative example 2. In addition, it is clear from FIG. 8 that the intensity at a binding energy value of about 55.4 eV, which arises from $Li_2CO_3$, is also higher in example 2 than in comparative example 2.

Therefore, it is also clear that a $Li_2CO_3$ layer is formed by the above-described laser irradiation in example 2.

In examples 1 and 2 described above, a nanosecond pulse laser was used, but the laser device used to radiate the laser light is not particularly limited. For example, a Kr—F excimer laser or a femtosecond laser may be used. In addition, the irradiation conditions only need to be selected in accordance with the laser device, the area and thickness of the $Li_2CO_3$ layer to be formed, and so on and are not particularly limited.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
  a piezoelectric substrate made of $LiNbO_3$ or $LiTaO_3$ and including first and second main surfaces that face each other;
  a functional electrode provided on the first main surface of the piezoelectric substrate to excite acoustic waves; and
  a $Li_2CO_3$ layer provided on the second main surface of the piezoelectric substrate.

2. The acoustic wave device according to claim 1, wherein the $Li_2CO_3$ layer is provided on the entire or substantially the entire second main surface of the piezoelectric substrate.

3. The acoustic wave device according to claim 1, wherein the $Li_2CO_3$ layer is provided on a portion of the second main surface of the piezoelectric substrate.

4. The acoustic wave device according to claim 1, wherein the functional electrode is an IDT electrode.

5. The acoustic wave device according to claim 1, further comprising:
  a frame-shaped support layer provided on the first main surface of the piezoelectric substrate and surrounding the IDT electrode; and
  a cover on a surface of the support layer on an opposite side from a surface of the support layer closest to the piezoelectric substrate so as to close an opening of the support layer; wherein
  a hollow portion is defined by the first main surface of the piezoelectric substrate, the support layer, and the cover.

6. The acoustic wave device according to claim 5, further comprising:
  a wiring line electrode provided on the second main surface of the piezoelectric substrate and electrically connected to the functional electrode.

7. The acoustic wave device according to claim 6, wherein
  a through hole is provided that penetrates through the support layer and the cover;
  the acoustic wave device further comprising:
    an under bump metal layer provided inside the through hole and one end of which is connected to the wiring line electrode; and
    a metal bump connected to another end of the under bump metal layer.

8. The acoustic wave device according to claim 6, further comprising:
  a terminal electrode provided on the second main surface of the piezoelectric substrate; and
  a connection electrode that electrically connects the terminal electrode and the wiring line electrode to each other.

9. The acoustic wave device according to claim 8, wherein the connection electrode includes a portion located on a side surface of the piezoelectric substrate that connects the first main surface and the second main surface of the piezoelectric substrate to each other.

10. The acoustic wave device according to claim 1, wherein the piezoelectric substrate is made of $LiNbO_3$.

11. The acoustic wave device according to claim 1, wherein the piezoelectric substrate is made of $LiTaO_3$.

12. The acoustic wave device according to claim 1, wherein the functional electrode includes an IDT electrode and reflectors disposed on either side of the IDT electrode in a propagation direction of the acoustic waves.

13. The acoustic wave device according to claim 5, wherein the frame-shaped support layer is made of a composite resin.

14. The acoustic wave device according to claim 5, wherein the cover is made of alumina or a composite resin.

* * * * *